(12) United States Patent
Tejnil

(10) Patent No.: US 9,798,226 B2
(45) Date of Patent: Oct. 24, 2017

(54) PATTERN OPTICAL SIMILARITY DETERMINATION

(71) Applicant: Mentor Graphics Corporation, Wilsonville, OR (US)

(72) Inventor: Edita Tejnil, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/245,869

(22) Filed: Aug. 24, 2016

(65) Prior Publication Data

US 2016/0363854 A1    Dec. 15, 2016

Related U.S. Application Data

(63) Continuation of application No. 14/253,171, filed on Apr. 15, 2014, now Pat. No. 9,459,523.

(51) Int. Cl.
| | | |
|---|---|---|
| G06F 17/00 | (2006.01) | |
| G03F 1/36 | (2012.01) | |
| G03F 7/20 | (2006.01) | |
| G06F 17/50 | (2006.01) | |

(52) U.S. Cl.
CPC ............... G03F 1/36 (2013.01); G03F 7/70 (2013.01); G03F 7/70433 (2013.01); G06F 17/5009 (2013.01)

(58) Field of Classification Search
USPC ........................................................ 716/53
See application file for complete search history.

(56) References Cited

U.S. PATENT DOCUMENTS

| | | | |
|---|---|---|---|
| 2003/0151833 A1 | 8/2003 | Berman et al. | |
| 2005/0257187 A1* | 11/2005 | Gallatin | G03F 1/70 716/53 |
| 2009/0193387 A1 | 7/2009 | Mukherjee et al. | |
| 2010/0203430 A1* | 8/2010 | Ye | G03F 1/36 430/5 |
| 2011/0245955 A1* | 10/2011 | Li | G01B 11/24 700/104 |
| 2012/0005634 A1* | 1/2012 | Seltmann | G03F 1/70 716/53 |
| 2012/0221982 A1 | 8/2012 | Jeong et al. | |
| 2013/0175240 A1* | 7/2013 | Vengertsev | G03F 1/36 216/24 |
| 2014/0064600 A1 | 3/2014 | Jeong | |

OTHER PUBLICATIONS

Edita Tejnil, et al., "Pattern Specific Optical Modes", J. Vac. Sci. Technol., B 26, 2441 (2008).
May 25, 2016—(US) Notice of Allowance—U.S. Appl. No. 14/253,171.
Oct. 29, 2015 (US) Non-Final Office Action—U.S. Appl. No. 14/253,171.

* cited by examiner

Primary Examiner — Mohammed Alam
(74) Attorney, Agent, or Firm — Banner & Witcoff, Ltd.

(57) ABSTRACT

Aspects of the invention relate to techniques for determining pattern optical similarity in lithography. Optical kernel strength values for a first set of layout features and a second set of layout features are computed first. Based on the optical kernel strength values, optical similarity values between the first set of layout features and the second set of layout features are then determined. Subsequently, calibration weight values for the first set of layout features may be determined based on the optical similarity values, which, along with the first set of layout features, may be employed to calibrate lithography process model parameters.

20 Claims, 8 Drawing Sheets

PATTERN OPTICAL SIMILARITY DETERMINATION

CROSS-REFERENCE TO RELATED APPLICATIONS

This application is a continuation of U.S. patent application Ser. No. 14/253,171, entitled "Pattern Optical Similarity Determination," filed Apr. 15, 2014, which is incorporated by reference herein in its entirety.

FIELD OF THE INVENTION

The present invention relates to the field of lithography. Various implementations of the invention may be particularly useful for determining pattern optical similarity.

BACKGROUND OF THE INVENTION

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. For example, as shown in FIG. 3A, an edge of the geometric element 301 used to create a mask feature 300 may be fragmented into edge fragments 301A-301F, shown in FIG. 3B. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments.

The model-based OPC process also simulates the printed image. That is, the photolithographic process is simulated in order to produce a simulated printed image (referred to as simulated image), such as the example image 302 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Next, the edge fragments are individually moved or adjusted in order to enable the simulated image for the resulting mask to reproduce the target image as much as possible. For example, as shown in FIG. 3D, the edge fragment 301A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

The performance of an OPC process depends in part on the accuracy and predictability of lithographic process models that mathematically represent the distinct steps in the patterning sequence. These lithographic process models (sometimes also referred to as OPC models) include optical models for aerial image formation and resist/etch process models for the photoresist-associated steps such as exposure, post-exposure bake, development, and pattern transfer. The optical models for full-chip simulation are usually quasi-rigorous. For example, the Hopkins optical model may be approximated by a sum of coherent systems approximation method, which is not a dramatic simplification. By contrast, the resist/etch process models tend to be semi-empirical: mathematical formulation is used to provide a transfer function between inputs and measured outputs of interest. Due to the semi-empirical nature, the resist/etch process models need to be calibrated based on measurements on printed wafers. The model parameters are trained or calibrated so that simulation data would fit measurement data. Even some parameters for the optical models such as dose and focus may also need to be calibrated against measurement data. In a calibration process, the calibration of the optical model parameters may be performed first. With the optical model parameters thus set, a subsequent tuning of the resist model parameters is performed. Alternatively, the tuning of both the optical model parameters and the resist model parameters may be conducted simultaneously in a single lumped calibration process.

The accuracy and predictability of lithographic process models often refer to the distribution of critical dimension differences between values predicted by the models and measured values. There are two types of test structures associated with the model calibration: those for calibrating model parameters are referred to as calibration structures; and those for checking the predictability of the calibrated models are referred to as verification structures. The extent to which different varieties of calibration structures are used to calibrate model parameters affects the layout coverage of the calibrated models. Thus, the adequacy of calibration structures is important whenever the model accuracy and predictability are in question. In reality, the number of unique structures in a design is several orders of magnitude more than the number of calibration structures. Moreover, the verification process based on measurements is slow. It is thus desirable to have a quick method for evaluating and adjusting calibration structures.

BRIEF SUMMARY OF THE INVENTION

Aspects of the invention relate to techniques for determining pattern optical similarity in lithography. In one aspect, there is a method comprising: computing optical kernel strength values for a first set of layout features and optical kernel strength values for a second set of layout features; and determining optical similarity values between the first set of layout features and the second set of layout features based on the optical kernel strength values for a first set of layout features and the optical kernel strength values for a second set of layout features. Each layout feature in the first set of layout features may be associated with a part of a calibration structure for model calibration and each layout feature in the second set of layout features is associated with a part of a verification structure for model verification.

The computing optical kernel strength values may comprise: calculating peak-to-valley intensity contribution values of optical kernels to image intensity of a layout feature. The determining optical similarity values may comprise: calculating normalized cross-correlation values between the optical kernel strength values for the first set of layout features and the optical kernel strength values for the second set of layout features.

According to some embodiments of the invention, the method may further comprise: determining calibration weight values for the first set of layout features based on the optical similarity values. The determining calibration weight values may comprise: calculating a number of layout features in the second set of layout features that have the optical similarity values above a predetermined threshold value. The method may still further comprise: calibrating lithography process model parameters based on the first set of layout features and the calibration weight values.

According to some other embodiments of the invention, the method may further comprise: calibrating lithography process model parameters based on the first set of layout features and the calibration weight values. The method may still further comprise: changing the first set of layout features based on the verification weight values.

In another aspect, there are one or more non-transitory processor-readable media storing processor-executable instructions for causing one or more processors to perform a method, the method comprising: computing optical kernel strength values for a first set of layout features and optical kernel strength values for a second set of layout features; and determining optical similarity values between the first set of layout features and the second set of layout features based on the optical kernel strength values for a first set of layout features and the optical kernel strength values for a second set of layout features.

In still another aspect, there is a system, comprising: one or more processors, the one or more processors programmed to perform a method, the method comprising: computing optical kernel strength values for a first set of layout features and optical kernel strength values for a second set of layout features; and determining optical similarity values between the first set of layout features and the second set of layout features based on the optical kernel strength values for a first set of layout features and the optical kernel strength values for a second set of layout features.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION OF THE INVENTION

General Considerations

Figure 1:
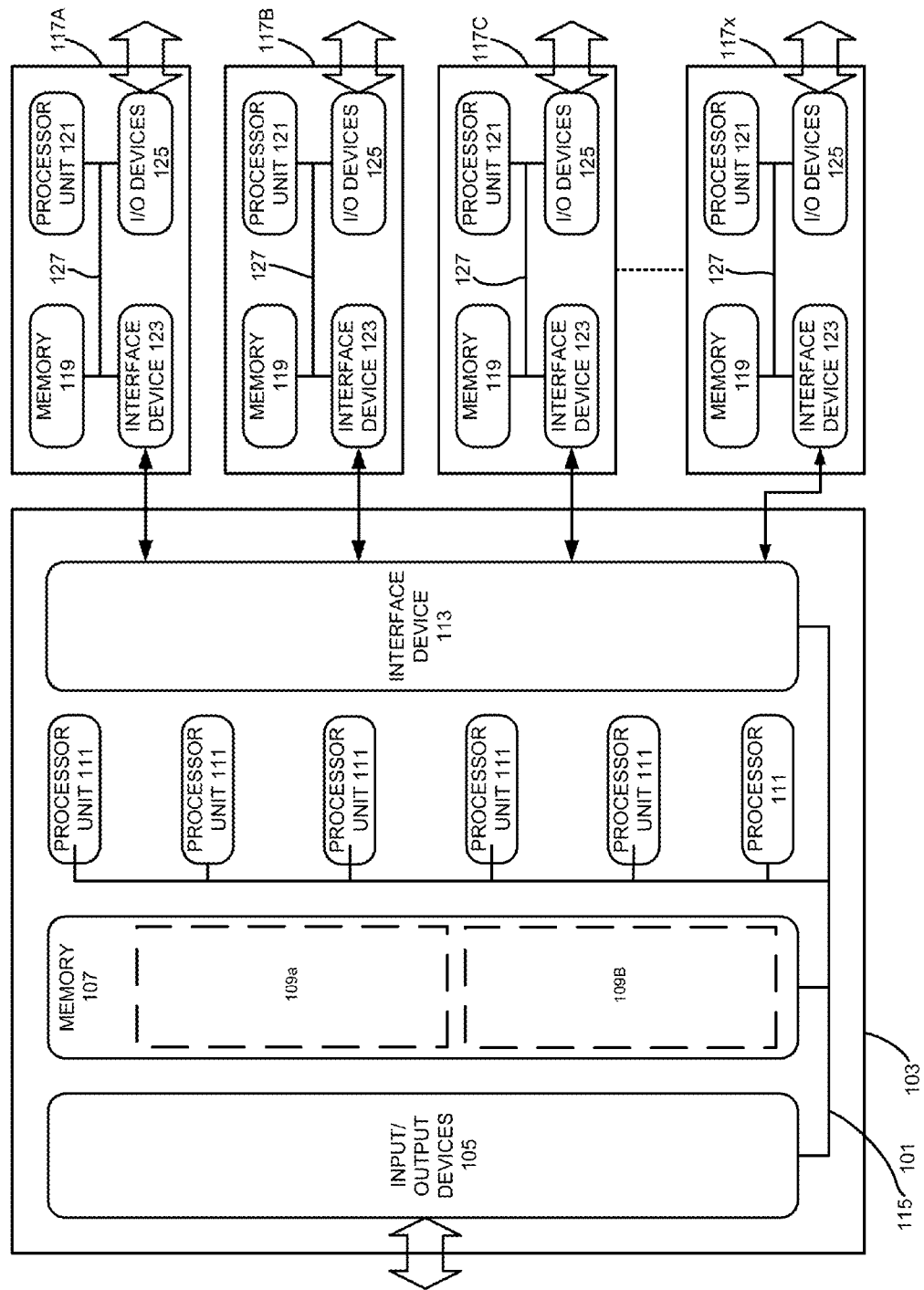
FIG. 1 illustrates an example of a computing system that may be used to implement various embodiments of the invention.

Various aspects of the present invention relate to techniques for determining pattern optical similarity in lithography. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine", "compute" and "calculate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of concurrently running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
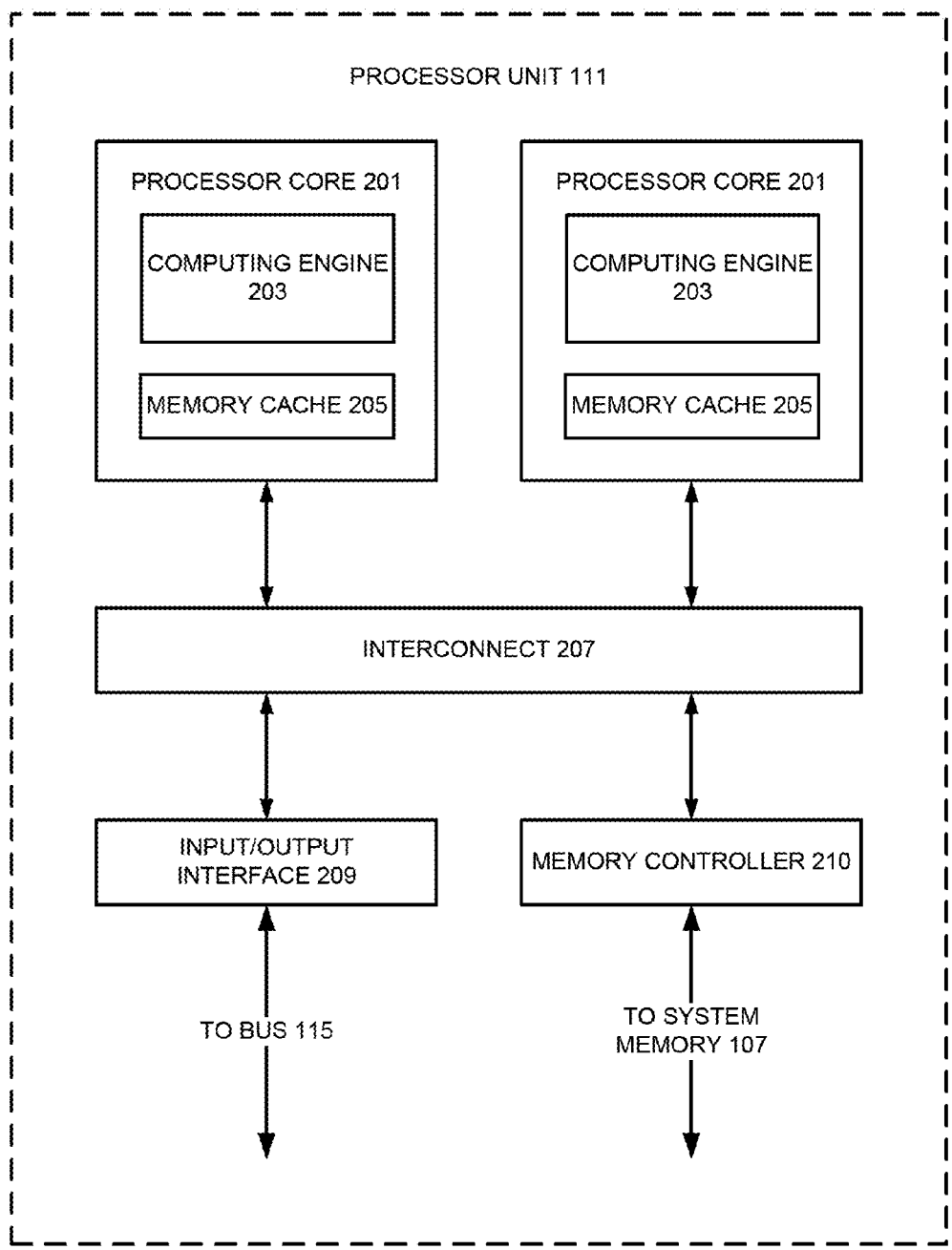
FIG. 2 illustrates an example of a multi-core processor unit that may be used to implement various embodiments of the invention.
Figure 3A:
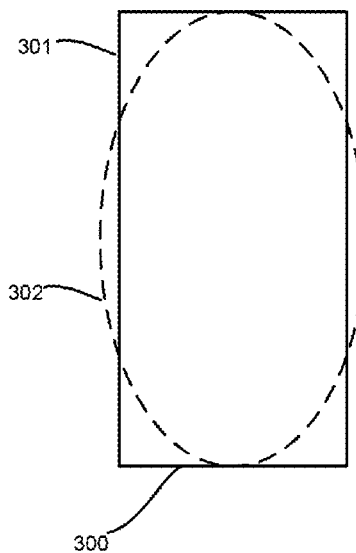
FIG. 3A illustrates a mask feature 300 and a simulated image of the mask feature.
Figure 3C:
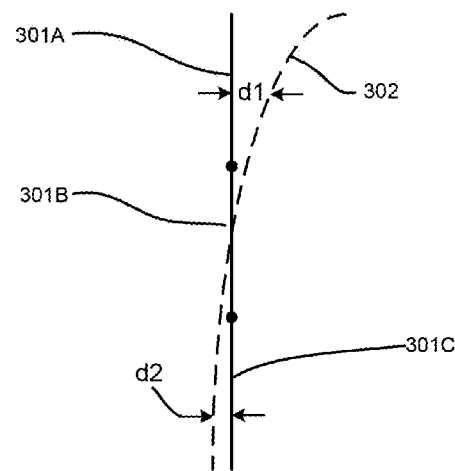
FIG. 3C illustrates edge displacement errors for some of the edge fragments.
Figure 3B:
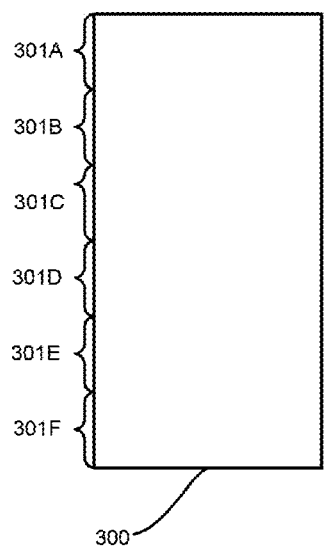
FIG. 3B illustrates an example of fragmentation of an edge of the mask feature 300.
Figure 3D:
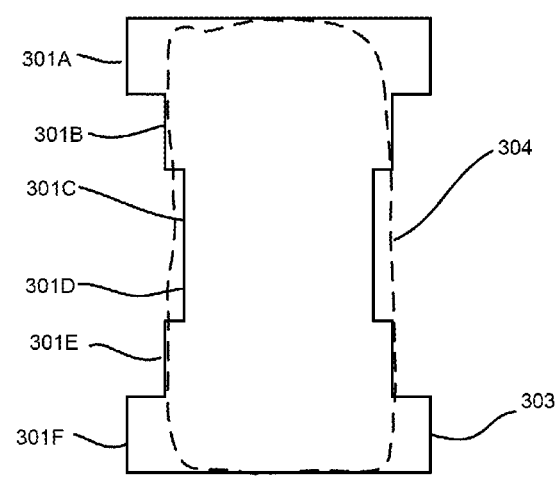
FIG. 3D illustrates a mask feature modified from the mask feature 300 by an OPC process and a corresponding simulated image.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Optical Kernel Strength

With the reduction in feature size, the OPC model complexity increases. The aerial image calculation portion of an OPC model often requires significant increase in computational resources. A conventional approach for fast image calculations utilizes the Hopkins formulation of the imaging equations and the sum-of-coherent systems (SOCS) approximation. The SOCS approximation decomposes the optical system response function into a sum of products of its eigenvalues and eigenfunctions, or kernels, via singular value decomposition. The partially-coherent optical imaging system is then represented as a sum of images formed by coherently illuminated optical systems with transfer functions corresponding to the kernels of the optical system response, weighted by the corresponding eigenvalues.

The contribution of each term to the final image depends not only on the optical system, described by its eigenvalues and kernels, but also on the mask pattern. Since the complex exposures schemes needed for resolution improvement impose design rule restrictions on the layout, layout simplification has accompanied resolution enhancement in practice. The optical image models used in OPC are based on the Hopkins formulation of the partially coherent imaging equations, where the intensity $I(\vec{x})$ at the image plane point $\vec{x}$ is given by:

$$I(\vec{x}) = \int\int\int\int_{-\infty}^{+\infty} tcc(\vec{f}';\vec{f}'')m(\vec{f}')m^*(\vec{f}'')e^{-2\pi i(\vec{f}'-\vec{f}'')\vec{x}}d\vec{f}'d\vec{f}'' \quad (1)$$

$$tcc(\vec{f}';\vec{f}'') = \int\int_{-\infty}^{+\infty} j_0(\vec{f})k(\vec{f}+\vec{f}')k^*(\vec{f}+\vec{f}'')d\vec{f}. \quad (2)$$

The vector $\vec{f}$ designates the spatial frequency coordinates in the pupil plane, and $j_0^-(\vec{f})$, $m(\vec{f})$, and $k(\vec{f})$ represent the pupil-plane versions of the mutual intensity incident on the mask, the mask pattern transmission, and the pupil function of the imaging system. They are related to their object or image plane counterparts $J_0^-(\vec{x})$, $M(\vec{x})$, and $K(\vec{x})$, respectively, via the two-dimensional Fourier transform. The optical system cross-correlation transform $tcc(\vec{f}';\vec{f}'')$ is also known as the transmission cross coefficients (TCC). In practice, the TCC is a four-dimensional low-pass filter that represents the spatial filtering produced by the imaging system, including the effects of the illumination source and wafer thin-film stack. The simple paraxial imaging analysis quoted above can be extended to a full vector treatment of the electromagnetic fields that includes the wafer thin-film effects and is appropriate at high numerical apertures (NA) of current photolithography imaging systems. Although the full vector treatment is more complex, its form is analogous to the above equations and can still be represented in terms of the transmission cross coefficients.

In computational lithography for full-chip applications, significant computational savings are obtained when the TCC transform is expressed using singular value decomposition, followed by an approximation of the full series by a partial sum over the TCC eigenvalues $\lambda_n$ and eigenfunctions $\phi_n(\vec{f})$:

$$tcc(\vec{f}';\vec{f}'') = \sum_n \lambda_n \phi_n(\vec{f}')\phi_n^*(\vec{f}'') \approx \sum_{n=0}^{N-1} \lambda_n \phi_n(\vec{f}')\phi_n^*(\vec{f}'') \quad (3)$$

This approximation is known as "sum of coherent systems" (SOCS) because the intensity in Equation 1 simply becomes $$I(\vec{x}) \approx \sum_{n=0}^{N-1} \lambda_n |\Phi_n(\vec{x}) * M(\vec{x})|^2 = \sum_{n=0}^{N-1} I_n(\vec{x}) \quad (4)$$

where * denotes convolution. This expression has the form of a sum of intensities of N fully coherent optical systems having pupil functions that are equivalent to the TCC eigenfunctions, also known as "optical kernels". Here $\Phi_n(\vec{x})$ represents the Fourier transform of the eigenfunction $\phi_n(\vec{f})$ and $I_n(\vec{x})$ corresponds to the intensity contributed by the $n^{th}$ term. In OPC applications, the discretized TCC typically has several hundred to several thousand terms. On the other hand, the number of significant SOCS terms is usually on the order of ten to one hundred, resulting in a significant computational efficiency improvement compared to the full expansion of Eq. (1).

The term "optical kernel strength" is used to describe the intensity contribution from each eigenfunction or optical kernel $\Phi_n(\vec{x})$. The optical kernel strength value for $\Phi_n(\vec{x})$ may be calculated as:

$$\max(I_n(\vec{x})) - \min(I_n(\vec{x})) \quad (5)$$

The optical kernel strength value derived from Eq. 5 depends on the mask pattern $M(\vec{x})$ as well as on the eigenvalue $\lambda_n$ and kernel function $\Phi_n(\vec{x})$.

Another method for calculating the optical kernel strength value does not scale with the eigenvalue $\lambda_n$:

$$\max(I_n(\vec{x})/\lambda_n) - \min(I_n(\vec{x})/\lambda_n) \quad (6)$$

It should be appreciated that Eqs. (5) and (6) are just two examples for calculating the optical kernel strength value. Different formula may be used for deriving a value that represents the intensity contribution from an optical kernel.

Optical Similarity Determination Tools And Methods

Figure 4:
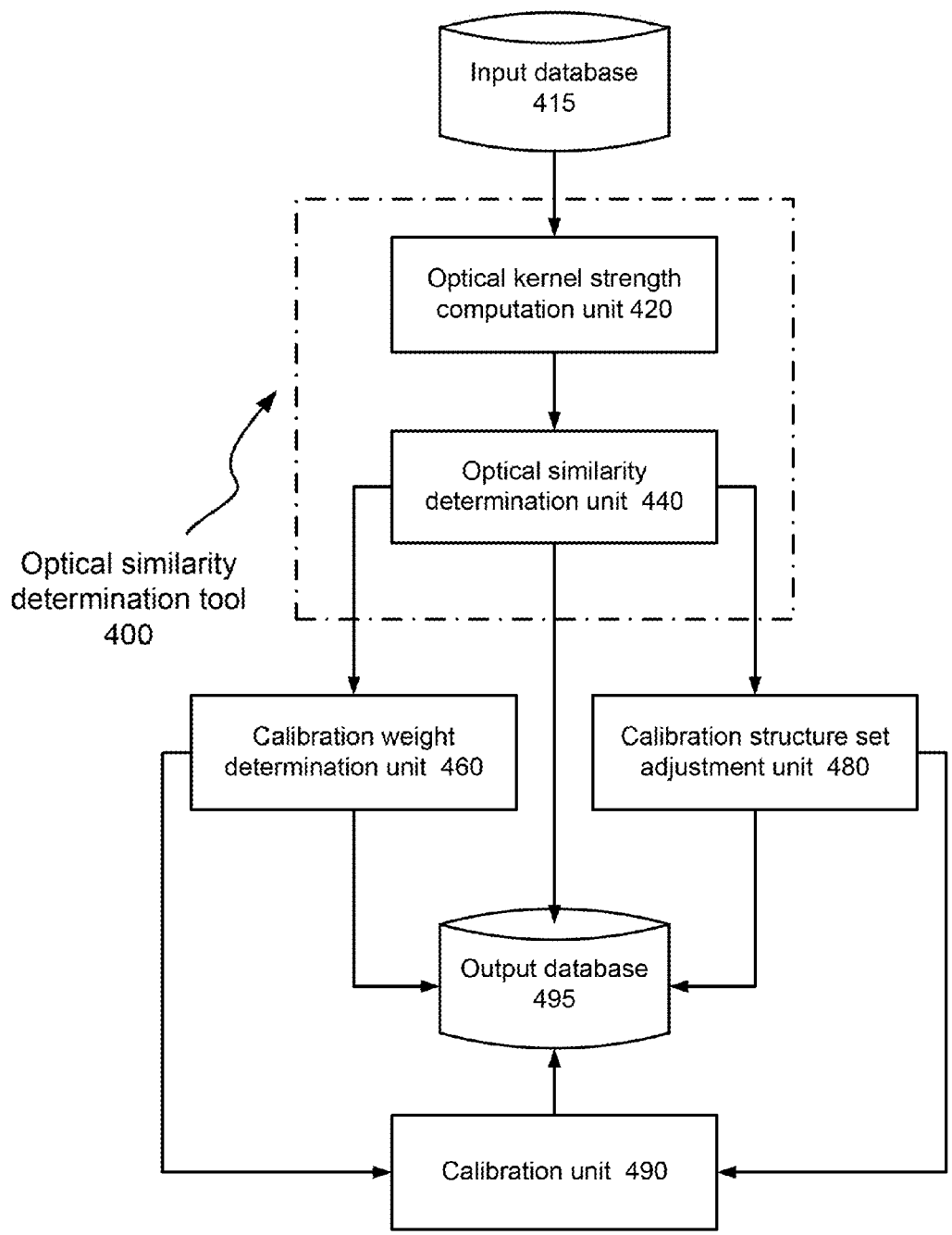
FIG. 4 illustrates an example of an optical similarity determination tool according to various embodiments of the invention.

FIG. 4 illustrates an example of an optical similarity determination tool according to various embodiments of the invention. As seen in the figure, the optical similarity determination tool 400 includes two units: an optical kernel strength computation unit 420 and an optical similarity determination unit 440. Some implementations of the optical similarity determination tool 400 may cooperate with (or incorporate) one or more of an input database 415, an output database 495, a calibration weight determination unit 460, a calibration structure set adjustment unit 480 and a calibration unit 490.

As will be discussed in more detail below, the optical kernel strength computation unit 420 computes optical kernel strength values for a first set of layout features and optical kernel strength values for a second set of layout features. Using the computed optical kernel strength values, the optical similarity determination unit 440 determines optical similarity values between the first and second sets of layout features. With various implementations of the invention, the first set of layout features may be associated with a set of calibration structures and the second set of layout features may be associated with a set of verification structures. The calibration weight determination unit 460 may determines calibration weight values based on the optical similarity values. The determined calibration weight values may be employed along with the first set of layout features for calibrating OPC models. Alternatively or additionally, the calibration structure set adjustment unit 480 may determine verification weight values for the second set of layout features based on the optical similarity values. Based on the verification weight values, the calibration unit 490 may change the first set of layout features by, e.g., adding and/or deleting layout features.

As previously noted, various examples of the invention may be implemented by a multiprocessor computing system, such as the computing system illustrated in FIGS. 1 and 2. Accordingly, one or more of the optical kernel strength computation unit 420, the optical similarity determination unit 440, the calibration weight determination unit 460, the calibration structure set adjustment unit 480 and the calibration unit 490 may be implemented by executing programming instructions on one or more processors in a computing system such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the optical kernel strength computation unit 420, the optical similarity determination unit 440, the calibration weight determination unit 460, the calibration structure set adjustment unit 480 and the calibration unit 490. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

It also should be appreciated that, while the optical kernel strength computation unit 420, the optical similarity determination unit 440, the calibration weight determination unit 460, the calibration structure set adjustment unit 480 and the calibration unit 490 are shown as separate units in FIG. 4, a single servant computer (or a single processor within a master computer) may be used to implement two or more of these units at different times, or components of two or more of these units at different times.

With various examples of the invention, the input database 415 and the output database 495 may be implemented using any suitable computer readable storage device. That is, either of the input database 415 and the output database 495 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 415 and the output database 495 are shown as separate units in FIG. 4, a single data storage medium may be used to implement some or all of these databases.

Figure 5:
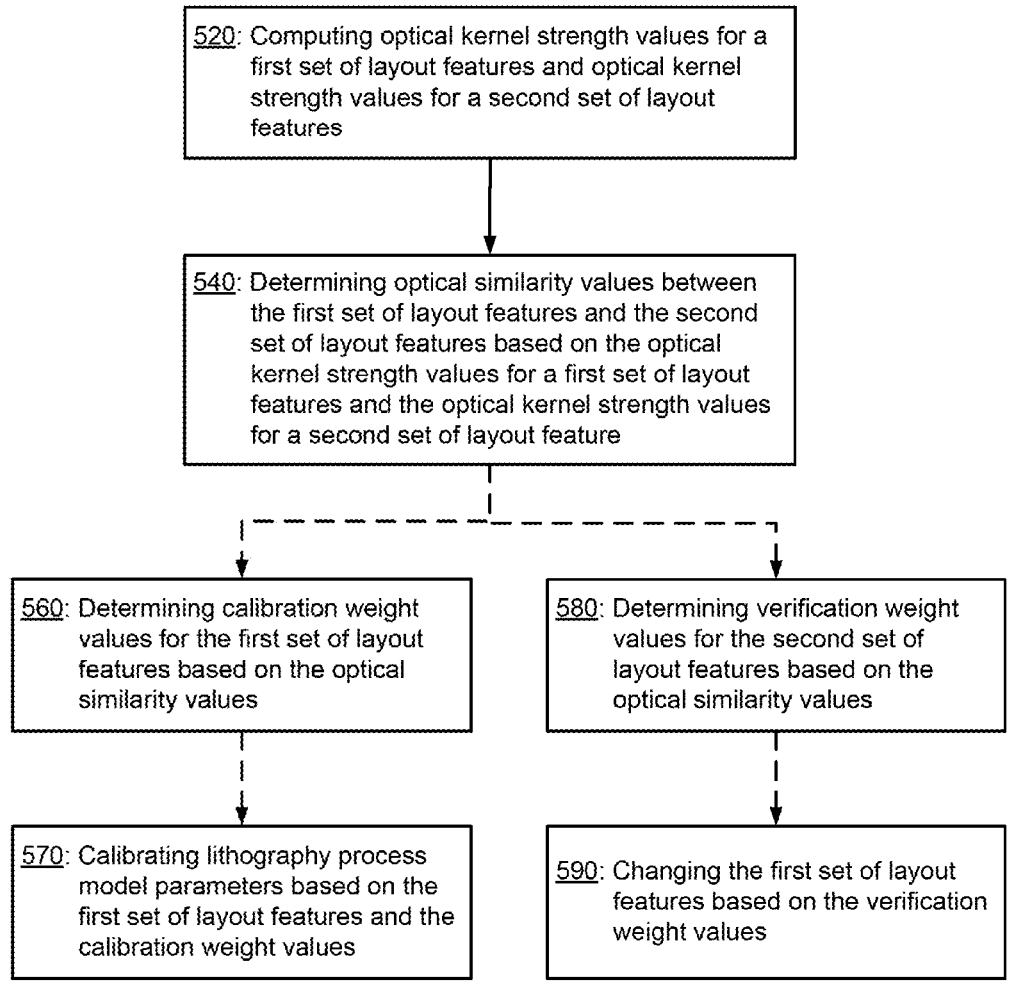
FIG. 5 illustrates a flowchart showing a process for determining optical similarity values that may be implemented according to various examples of the invention.

FIG. 5 illustrates a flowchart showing a process for determining optical similarity values that may be implemented according to various examples of the invention. For ease of understanding, methods for determining optical similarity values that may be employed according to various embodiments of the invention will be described with reference to the optical similarity determination tool 400 illustrated in FIG. 4 and the flow chart 500 in FIG. 5. It should be appreciated, however, that alternate implementations of an optical similarity determination tool may be used to perform the method of optical similarity determination shown in the flow chart 500 according to various embodiments of the invention. In addition, it should be appreciated that implementations of the optical similarity determination tool 400 may be employed to implement methods of optical similarity determination according to different embodiments of the invention other than the one illustrated by the flow chart 500 in FIG. 5.

Initially, in operation 520 of the flow chart 500, the optical kernel strength computation unit 420 computes optical kernel strength values for a first set of layout features and optical kernel strength values for a second set of layout features. A layout feature in the first set of layout features may be associated with a part of a calibration structure for model calibration and a layout feature in the second set of layout features may be associated with a part of a verification structure for model verification.

Figure 6:
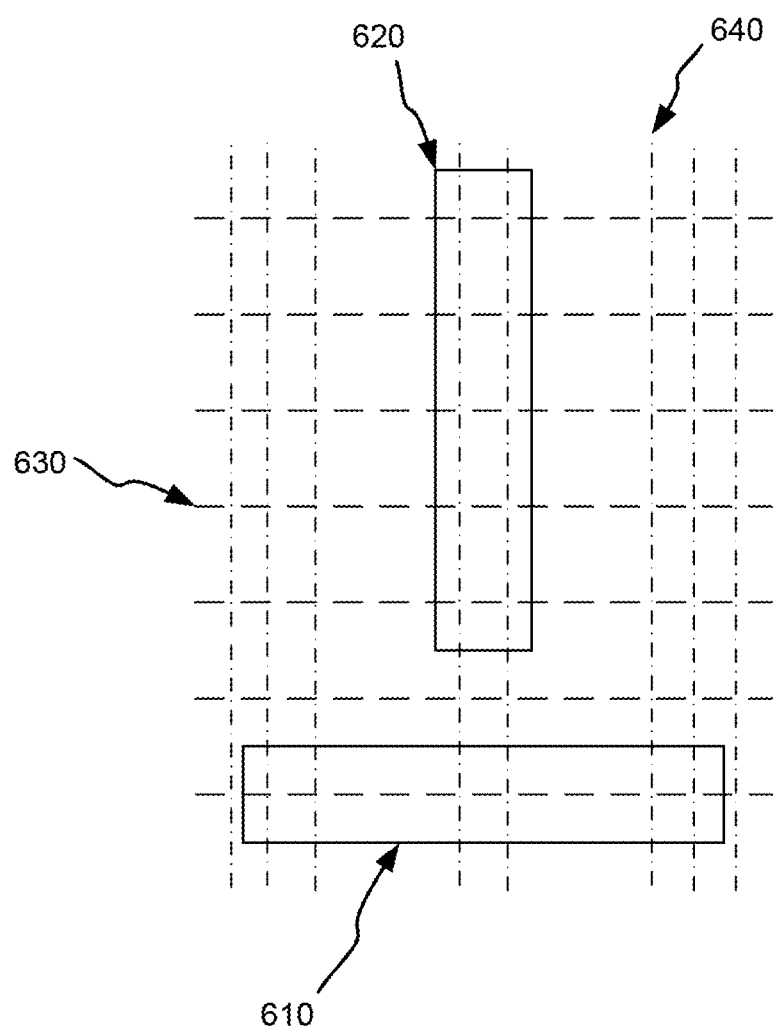
FIG. 6 illustrates an example of a calibration structure and its associated layout features according to some embodiments of the invention.

FIG. 6 illustrates an example of a calibration structure with its associated layout features according to some embodiments of the invention. The calibration structure comprises a horizontal bar 610 and a vertical bar 620. The two bars form a line-end-line-edge shape. Horizontal lines 630 and vertical lines 640 represent metrology measurement to be made on the calibration structure after being predicted by simulation using lithographic process models. The metrology measurement usually includes determining a maximum light intensity, a minimum light intensity, and a slope of change of intensity along each of the horizontal and vertical lines 630 and 640. The horizontal and vertical lines 630 and 640 are examples of the layout features, for which the kernel strength values are to be computed by the optical kernel strength computation unit 420 according to some embodiments of the invention. During a calibration process, SEM (scanning electron microscope) measurements are performed on patterns corresponding to the calibration structure. The measurements on simulated and fabricated patterns are compared.

To compute the optical kernel strength values, the optical kernel strength computation unit 420 may calculate peak-to-valley intensity contribution values of optical kernels to image intensity of a layout feature based on Eq. (5), Eq. (6) or other formula. Due to various shapes of the light sources employed in lithography, some optical kernels form degenerate optical kernel pairs. One optical kernel strength value may be computed for each pair of the degenerate optical kernels.

Next, in operation 540, the optical similarity determination unit 440 determines optical similarity values between the first set of layout features and the second set of layout features based on the optical kernel strength values for a first set of layout features and the optical kernel strength values for a second set of layout features. An optical similarity value between two layout features represents the degree of optical similarity between the two layout features. It may be derived by calculating cross-correlation between the optical kernel strength values for the two layout features.

According to some embodiments of the invention, the normalized cross-correlation method may be employed by the optical similarity determination unit 440 to determine an optical similarity value for each feature pair:

$$C_{Gc,Gv} = \frac{1}{K}\sum_{k}^{K} \frac{(S_{Gc}(k) - \mu_{Gc})(S_{Gv}(k) - \mu_{Gv})}{\sigma_{Gc}\sigma_{Gv}} \quad (7)$$

where the sum is over optical kernels or optical kernel pairs, S(k) is optical strength, and μ and σ denote mean and standard deviation of S(k).

Figure 7A:
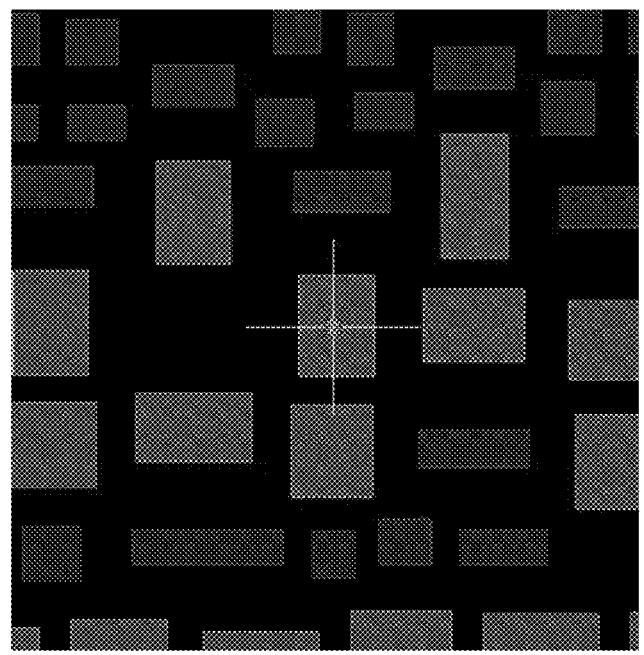
FIG. 7A illustrates a layout pattern and two perpendicular layout features crossing in the middle of the layout pattern.
Figure 7B:
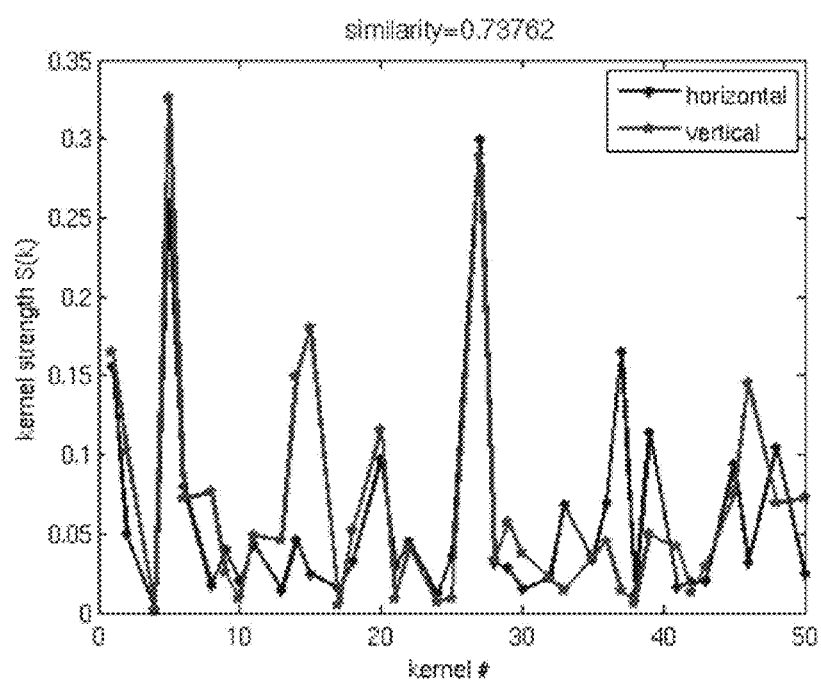
FIG. 7B illustrates a graph of optical kernel strength values over the first fifty optical kernels for the two layout features in FIG. 7A.

FIG. 7A illustrates a layout pattern and two perpendicular layout features crossing in the middle of the layout pattern. The lengths of the two layout features are about 160 nm each. FIG. 7B illustrates a graph of optical kernel strength values over the first fifty optical kernels for the two layout features in FIG. 7A. Also shown in the figure is the optical similarity value between the two layout features: 0.73762 that is derived from the optical kernel strength values. The magnitude of the optical similarity value indicates that the two layout features have relatively high optical similarity.

Figure 8A:
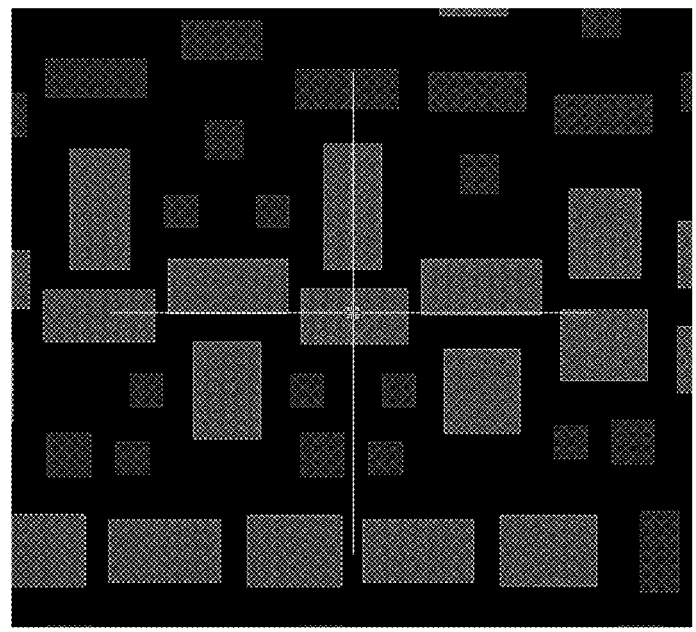
FIG. 8A illustrates a layout pattern similar to the one in FIG. 7A and two perpendicular layout features also similar to but longer than the corresponding ones in FIG. 7B.
Figure 8B:
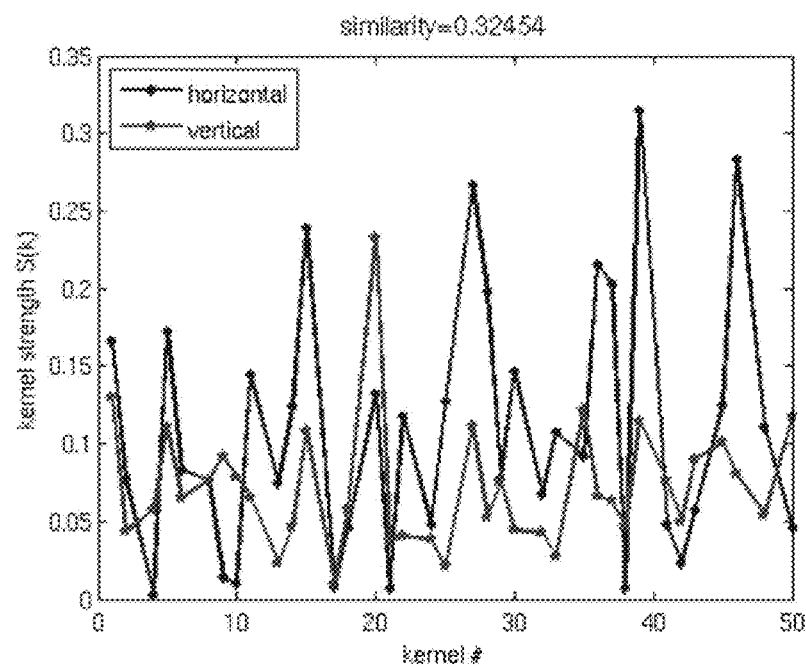
FIG. 8B illustrates a graph of optical kernel strength values over the first fifty optical kernels for the two layout features in FIG. 8A.

FIG. 8A illustrates a layout pattern similar to the one in FIG. 7A. But the two layout features in FIG. 8A have longer lengths than those in FIG. 7A (500 nm vs. 160 nm). FIG. 8B illustrates a graph of optical kernel strength values over the first fifty optical kernels for the two layout features in FIG. 8A. Compared to those in FIG. 7B, the two sets of optical kernel strength values in FIG. 8B did not correlate well. This is confirmed by the low optical similarity values: 0.32454.

The optical similarity values obtained in the operation 540 can be applied in various lithographic applications. In operation 560, for example, the calibration weight determination unit 460 determines calibration weight values for the first set of layout features based on the optical similarity values. With various implementations of the invention, a calibration weight value for a particular layout feature in the first set of layout features is determined based on the number of layout features in the second set of layout features that are optically similar to the particular layout feature. For example, a threshold value for the optical similarity values may be set first. The calibration weight value $w_c$ for the particular layout feature may be derived by counting the number $N_c$ of layout features in the second set having the optical similarity values greater than the threshold value:

$$w_c = 1 + N_c \quad (8)$$

Another method to derive the calibration weight value $w_c$ for the particular layout feature in the first set takes into account relative frequency values of layout features in the first set that have significant optical similarity values with a specific layout feature in the second set:

$$w_c = 1 + C \sum_v M_v / N_v \quad (9)$$

where $M_v$ is 1 or 0 if the specific layout feature in the second set is or is not similar to the particular layout feature, $N_v$ is the number of layout features in the first set that are similar (e.g. having the optical similarity values above the predetermined threshold value) to the specific layout feature in the second set, and C is a normalization constant.

Another method is to derive a weighted count as the calibration weight value. In this method, the calibration weight value depends not only on the number of layout features in the second set of layout features that are optically similar to the particular layout feature but also on the magnitudes of the optical similarity values. For example, the extent of an optical similarity value above the threshold will be taken into account in deriving the calibration weight value.

In operation 570, the calibration unit 490 calibrates lithography process model parameters based on the first set of layout features and the calibration weight values computed in the operation 560. This enables the layout features with higher calibration weight values to have more impact on the calibration process. As such, the calibrated models may be able to better predict printed images of layout structures associated with the second set of layout features.

Alternatively or additionally, the first set of layout features may be adjusted based on the optical similarity values. In operation 580, the calibration structure set adjustment unit 480 first determines verification weight values for the second set of layout features based on the optical similarity values. The number of layout features in the first set of layout features that are optically similar to a layout feature in the second set of layout features are determined based on the optical similarity values. Methods similar to those used in the operation 560 may be applied.

In operation 590, the calibration structure set adjustment unit 480 then changes the first set of layout features based on the verification weight values. The verification weight value for a particular layout feature in the second set of layout features below a threshold value may indicate that this layout feature is not well represented in the first set of layout features. The calibration structure set adjustment unit 480 may thus add one or more layout features that are optically similar to the particular layout feature to the first set of layout features. Other adjustment may be employed as well.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method comprising:
   simulating a lithography process of a first set of layout features and a second set of layout features using a lithography model, wherein the lithography model is expressed as a plurality of functions that indicate light intensity on an image plane, wherein the simulating produces a first plurality of values representing respective contributions of the plurality of functions to imaging the first set of layout features and produces a second plurality of values representing respective contributions of the plurality of functions to imaging the second set of layout features;
   determining optical similarity values between the first set of layout features and the second set of layout features based on the first plurality of values and the second plurality of values wherein each of the optical similarity values indicate a degree of similarity between one or more layout features in the first set of layout features and one or more layout features in the second set of layout features; and
   changing the first set of layout features based on the optical similarity values.

2. The method of claim 1, further comprising determining calibration weight values of the lithography model, for the first set of layout features, based on the optical similarity values.

3. The method of claim 2, further comprising determining model parameters based on the calibration weight values.

4. The method of claim 1, further comprising determining weighted calibration weight values of the lithography model for the first set of layout features based on magnitudes of the optical similarity values.

5. The method of claim 4, wherein the determining the weighted calibration weight values comprises calculating a difference between an optical similarity value and a predetermined threshold.

6. The method of claim 1, further comprising determining verification weight values, for the second set of layout features, based on the optical similarity values.

7. The method of claim 6, wherein the determining the verification weight values comprises calculating a number of layout features in the second set of layout features having a respective optical similarity value above a predetermined threshold value.

8. The method of claim 6, wherein the changing the first set of layout features comprises changing, based on the verification weight values, the first set of layout features.

9. The method of claim 1, wherein the simulating comprises producing the first plurality of values by calculating respective peak-to-valley intensity contributions of the plurality of functions to imaging a layout feature of the first set of layout features.

10. The method of claim 9, wherein the plurality of functions comprises respectively a plurality of eigenfunctions of the lithography model, and wherein the respective peak-to-valley intensity contributions are unscaled by eigenvalues corresponding to the plurality of eigenfunctions.

11. The method of claim 1, wherein the determining the optical similarity values comprises calculating normalized cross-correlation values between the first plurality of values and the second plurality of values.

12. The method of claim 1, wherein the changing the first set of layout features comprises adding, to the first set of layout features, one or more layout features that are within a predetermined threshold optical similarity value of a layout feature in the first set of layout features.

13. One or more non-transitory computer-readable media with processor-executable instructions stored thereon, that, when executed by one or more processors, causes the one or more processors to:
   simulate a lithography process of a first set of layout features and a second set of layout features using a lithography model, wherein the lithography model is expressed as a plurality of functions that indicate light intensity on an image plane, wherein the simulating produces a first plurality of values representing respective contributions of the plurality of functions to imaging the first set of layout features and produces a second plurality of values representing respective contributions of the plurality of functions to imaging the second set of layout features;
   determine optical similarity values between the first set of layout features and the second set of layout features based on the first plurality of values and the second plurality of values wherein each of the optical similarity values indicate a degree of similarity between one or more layout features in the first set of layout features and one or more layout features in the second set of layout features; and
   change the first set of layout features based on the optical similarity values.

14. The one or more non-transitory computer-readable media of claim 13, wherein the processor-executable instructions, when executed by the one or more processors, cause the one or more processors to determine calibration weight values of the lithography model for the first set of layout features based on the optical similarity values.

15. The one or more non-transitory computer-readable media of claim 13, wherein the processor-executable instructions, when executed by the one or more processors, cause the one or more processors to determine verification weight values, for the second set of layout features, based on the optical similarity values.

16. The one or more non-transitory computer-readable media of claim 15, wherein the processor-executable instructions that, when executed by the one or more processors, cause the one or more processors to change the first set of layout features comprise processor-executable instructions that cause the one or more processors to change, based on the verification weight values, the first set of layout features.

17. The one or more non-transitory computer-readable media of claim 15, wherein the processor-executable instructions that, when executed by the one or more processors, cause the one or more processors to change the first set of layout features comprise processor-executable instructions that cause the one or more processors to add, to the first set of layout features, one or more layout features that are within a predetermined threshold optical similarity value of a layout feature in the first set of layout features.

18. A system, comprising:
   computer memory having software instructions stored thereon; and
   one or more computer processors that, when executing the software instructions, cause the system to:
      simulate a lithography process of a first set of layout features and a second set of layout features using a lithography model, wherein the lithography model is expressed as a plurality of functions that indicate light intensity on an image plane, wherein the simulating produces a first plurality of values representing respective contributions of the plurality of functions to imaging the first set of layout features and produces a second plurality of values representing respective contributions of the plurality of functions to imaging the second set of layout features;
      determine verification weight values of the second set of layout features; and
      change the first set of layout features based on the verification weight values.

19. The system of claim 18, wherein the instructions that cause the system to change the first set of layout features comprise instructions that cause the system to:
   add one or more layout features to the first set of layout features, or
   delete one or more layout features from the first set of layout features.

20. The method of claim 1, further comprising modifying, based on the optical similarity values, design layout data for a photolithographic mask.

* * * * *